United States Patent
Tsuda et al.

(10) Patent No.: US 11,281,116 B2
(45) Date of Patent: Mar. 22, 2022

(54) SUBSTRATE STAGE AND SUBSTRATE PROCESSING APPARATUS

(71) Applicant: Tokyo Electron Limited, Tokyo (JP)

(72) Inventors: Einosuke Tsuda, Nirasaki (JP); Daisuke Toriya, Nirasaki (JP); Satoshi Yonekura, Nirasaki (JP); Satoshi Takeda, Nirasaki (JP); Motoshi Fukudome, Nirasaki (JP); Kyoko Ikeda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/204,161

(22) Filed: Mar. 17, 2021

(65) Prior Publication Data

US 2021/0302846 A1   Sep. 30, 2021

(30) Foreign Application Priority Data

Mar. 24, 2020   (JP) .............................. JP2020-053330

(51) Int. Cl.
*G03B 27/52* (2006.01)
*G03F 7/20* (2006.01)

(52) U.S. Cl.
CPC ...... *G03F 7/70875* (2013.01); *G03F 7/70716* (2013.01)

(58) Field of Classification Search
CPC ............ G03F 7/70875; G03F 7/70716; H01L 21/67098
See application file for complete search history.

(56) References Cited

U.S. PATENT DOCUMENTS

| 5,220,171 A | * | 6/1993 | Hara | ....................... G03F 7/707 165/104.21 |
| 2018/0067398 A1 | * | 3/2018 | Cortie | .................. G03F 7/70875 |

FOREIGN PATENT DOCUMENTS

| JP | 2018-501653 A | | 1/2018 |
| KR | 20200047864 A | * | 5/2020 |

* cited by examiner

*Primary Examiner* — Peter B Kim
(74) *Attorney, Agent, or Firm* — Armstrong Teasdale LLP

(57) ABSTRACT

The present invention provides a substrate stage and a substrate processing apparatus that appropriately control a temperature of a staging surface on which a substrate is placed. The substrate stage includes a stage base including a cooling surface therein, and a supply flow path forming member formed of a material having a lower thermal conductivity than that of the stage base and including cooling nozzles configured to spray a coolant toward the cooling surface.

6 Claims, 5 Drawing Sheets

SUBSTRATE STAGE AND SUBSTRATE PROCESSING APPARATUS

CROSS-REFERENCE TO RELATED APPLICATION

This application is based upon and claims the benefit of priority from Japanese Patent Application No. 2020-053330, filed on Mar. 24, 2020, the entire contents of which are incorporated herein by reference.

TECHNICAL FIELD

The present disclosure relates to a substrate stage and a substrate processing apparatus.

BACKGROUND

A substrate processing apparatus, which performs a desired process (e.g., film formation, etching, or the like) on a substrate such as a wafer placed on a substrate stage, is known. Further, a substrate stage that controls a temperature of the substrate placed thereon is known.

Patent Document 1 discloses an electrostatic chuck assembly including an electrostatic chuck, a cooling plate arranged in contact with the electrostatic chuck and having a gas channel formed therein, and a gas box coupled to first and second ends of the gas channel in the cooling plate, in which the gas box is operable to control a flow rate of a cooling gas passing through the gas channel.

PRIOR ART DOCUMENT

[Patent Document]
Patent Document 1: Japanese Laid-Open Patent Publication No. 2018-501653

SUMMARY

According to an embodiment of the present disclosure, a substrate stage includes a stage base including a cooling surface therein, and a supply flow path forming member formed of a material having a lower thermal conductivity than that of the stage base and including cooling nozzles configured to spray a coolant toward the cooling surface.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
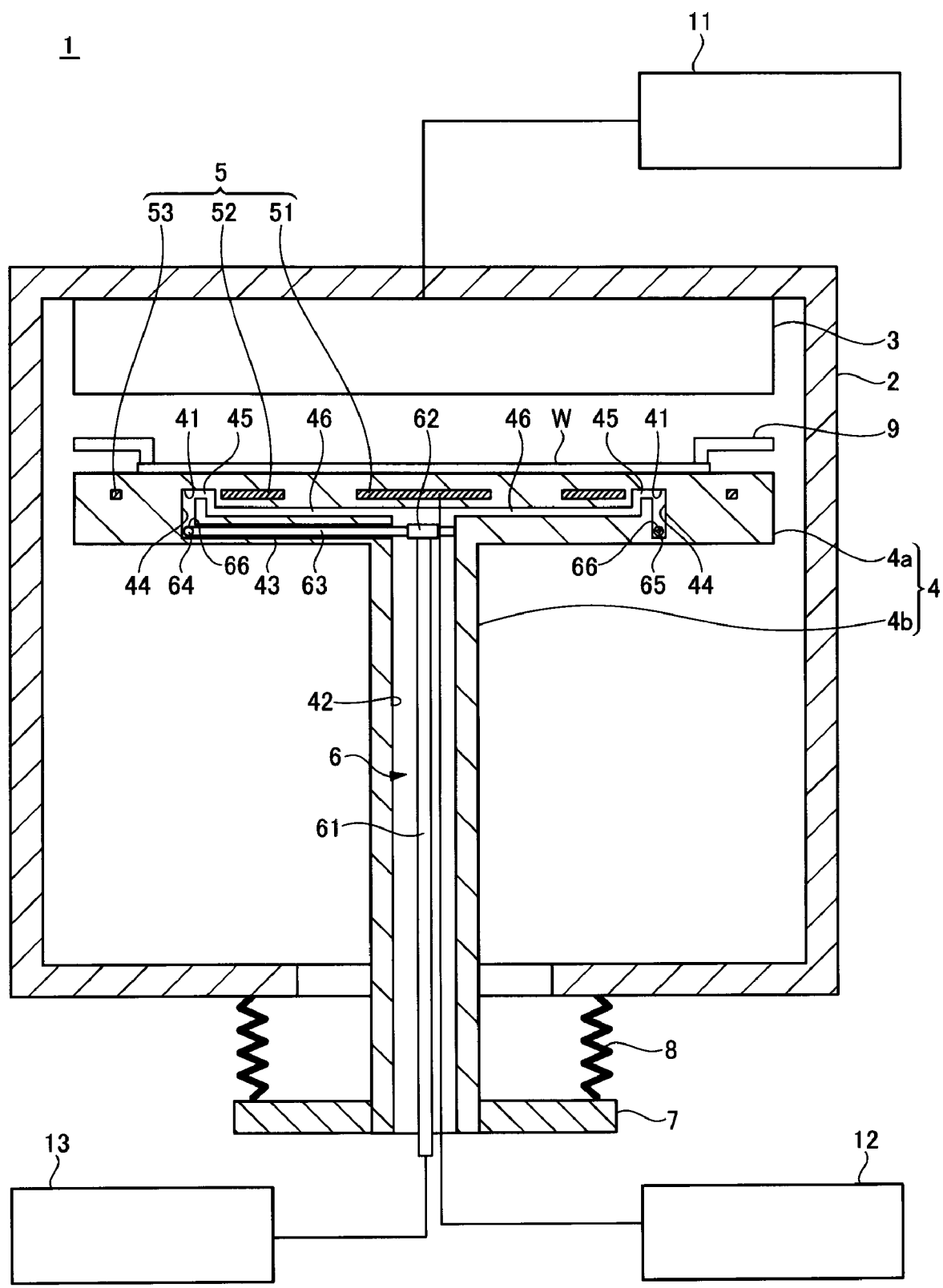
FIG. 1 is a schematic diagram of an example of a cross-sectional view illustrating a substrate processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

<Substrate Processing Apparatus 1>

A substrate processing apparatus 1 according to an embodiment will be described with reference to FIG. 1. FIG. 1 is a schematic diagram of an example of a cross-sectional view illustrating the substrate processing apparatus 1 according to an embodiment.

The substrate processing apparatus 1 includes a vacuum container 2, a gas supply 3, and a substrate stage 4. The substrate processing apparatus 1 is, for example, a thermal chemical vapor deposition (CVD) apparatus, in which a process gas is supplied from the gas supply 3 into the vacuum container 2 and a desired process (e.g., a film forming process) is performed on a substrate W such as a wafer placed on the substrate stage 4 in the vacuum container 2.

The vacuum container 2 has a vacuum port (not shown) and a carry-in and carry-out port (not shown). The vacuum port is connected to an exhaust apparatus (not shown), and is decompressed such that the inside of the vacuum container 2 becomes a vacuum atmosphere. The carry-in and carry-out port is configured to be opened and closed, and is configured such that the substrate W can be carried into and carried out of the vacuum container 2 through the carry-in and carry-out port.

The gas supply 3 is disposed above the substrate stage 4 in the vacuum container 2. The gas supply 3 supplies the process gas supplied from a gas supply source 11 into the vacuum container 2.

The substrate stage 4 includes a plate (a stage base) 4*a* on which the substrate W is placed, and a shaft 4*b* extending downward from the center of the rear surface of the plate 4*a*. The top surface of the plate 4*a* is a staging surface on which the substrate W is placed. The plate 4*a* is formed of a metal having a high thermal conductivity, such as aluminum.

Heaters 5 are provided inside the plate 4*a*. The heaters 5 include, for example, a center heater 51, a middle heater 52, and an outer heater 53. The center heater 51 is provided, for example, at the center of the plate 4*a*. The middle heater 52 is provided, for example, radially on an outer side of the plate 4*a* with respect to the center heater 51 and radially on an inner side of the outer circumference of the substrate W placed on the staging surface of the substrate stage 4. The outer heater 53 is provided, for example, radially on an outside of the plate 4*a* with respect to the middle heater 52 and radially on an inner side of the outer circumference of the substrate W placed on the staging surface of the substrate stage 4. Electric power is supplied to the heater 5 from a heater power supply 12.

A cooling surface 41 is provided inside the plate 4a. In addition, the substrate stage 4 includes a supply flow path forming member 6, which cools the cooling surface 41 by bringing a coolant in contact with the cooling surface 41. The cooling surface 41 is provided radially on an outer side of the plate 4a with respect to the middle heater 52, radially on an inner side of the plate 4a with respect to the outer heater 53, and radially on an inner side of the outer circumference of the substrate W placed on the staging surface of the substrate stage 4. A coolant is supplied to the supply flow path forming member 6 from a coolant supply source 13. As the coolant, a gas coolant such as an air coolant may be used. A configuration of the supply flow path forming member 6 will be described later with reference to FIGS. 2 and 3.

The shaft 4b penetrates through an opening formed in the bottom wall of the vacuum container 2 and extends downward of the vacuum container 2. A flange 7 is provided at a lower end of the shaft 4b. A bellows 8, which expands and contracts as the substrate stage 4 moves up and down, is provided between the lower end of the vacuum container 2 and the flange 7.

A clamp ring 9 is placed on the outer periphery of the top surface of the substrate W. The clamp ring 9 comes into contact with the outer periphery of the top surface of the substrate W, and presses the substrate W against the staging surface of the substrate stage 4 by the weight of the clamp ring 9 or a pressing force of, for example, a spring (not shown).

Figure 2:
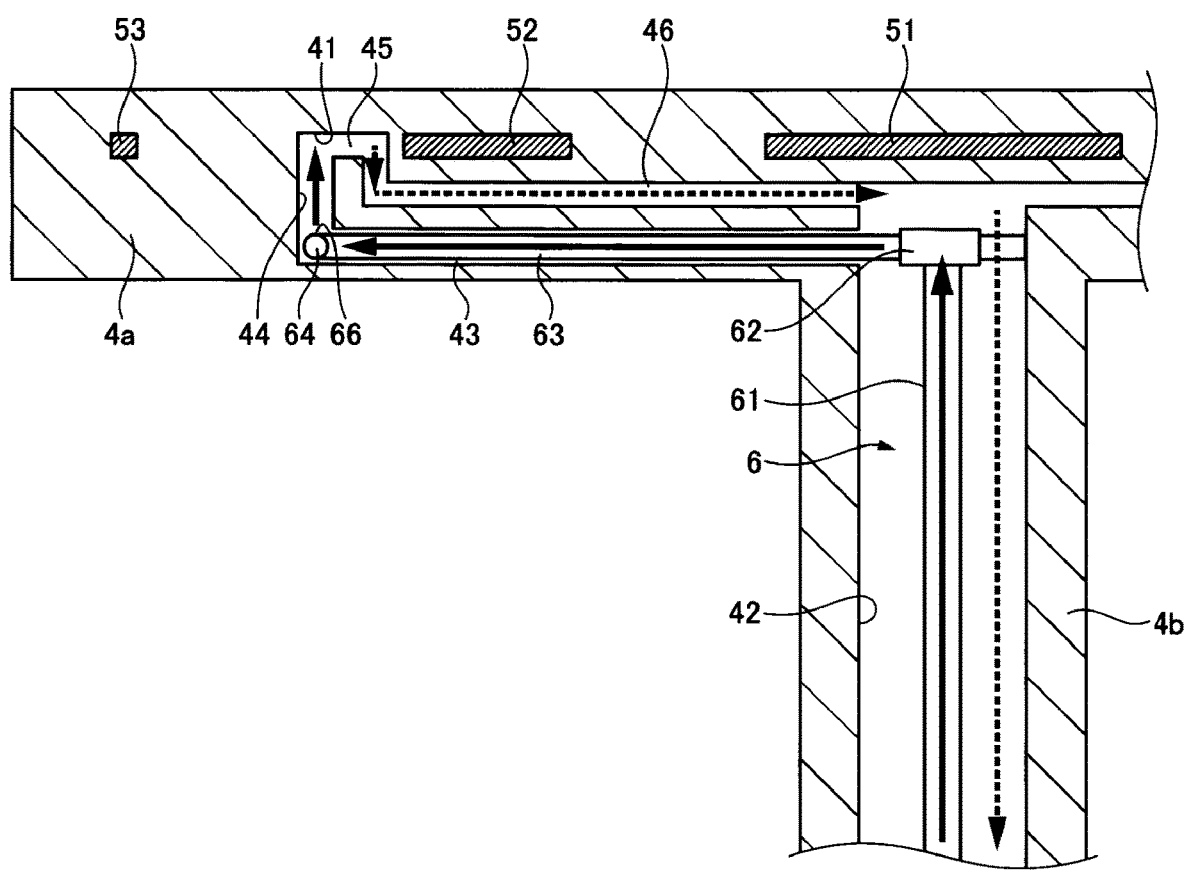
FIG. 2 is a schematic diagram of an example of a cross-sectional view illustrating an enlarged portion of a substrate stage.
Figure 3:
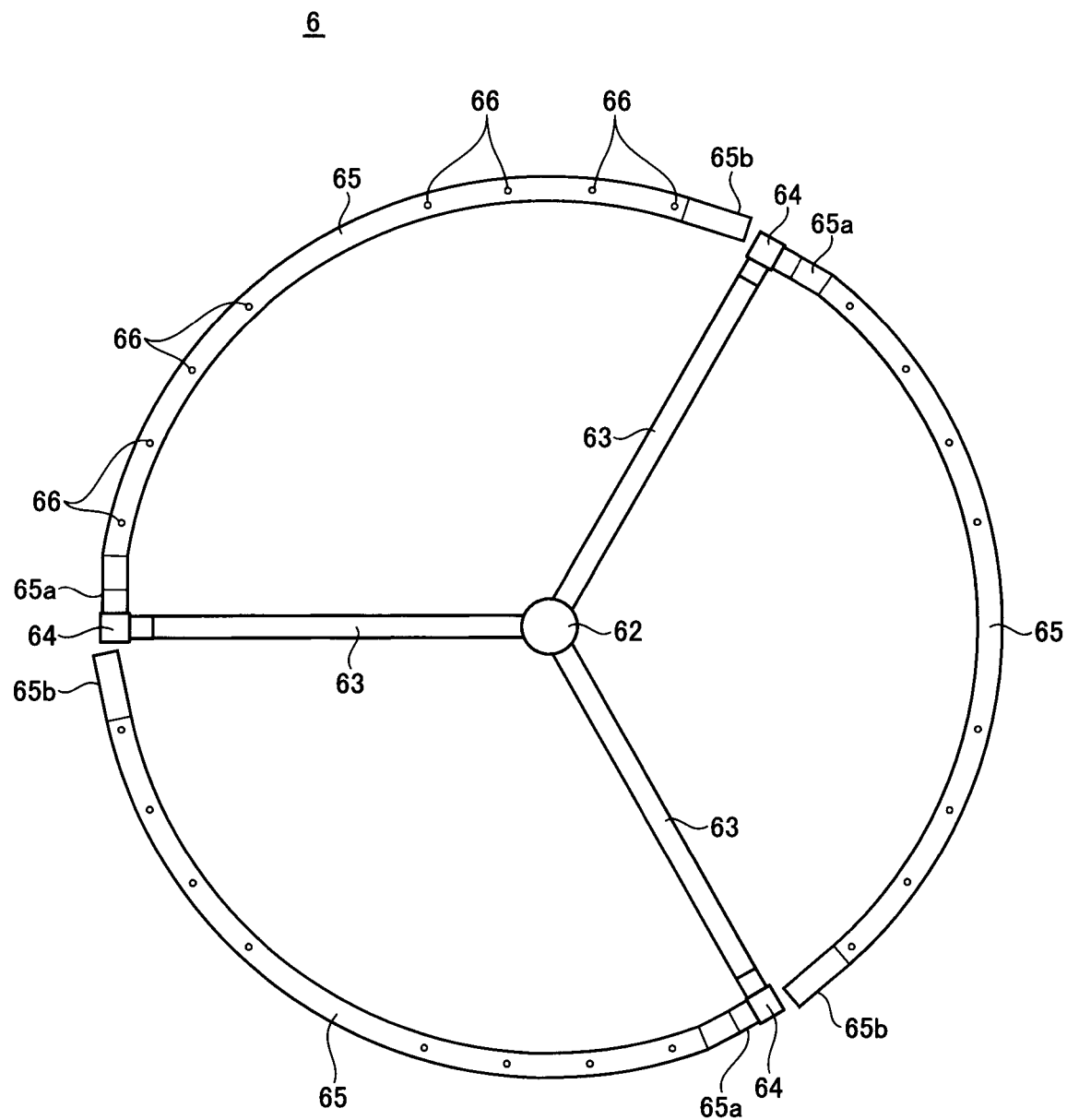
FIG. 3 is an example of a plan view showing a supply flow path forming member.

Next, the substrate stage 4 will be further described with reference to FIGS. 2 and 3. FIG. 2 is a schematic diagram of an example of a cross-sectional view illustrating an enlarged portion of the substrate stage 4. FIG. 3 is an example of a plan view showing the supply flow path forming member 6. Further, in FIG. 2, a flow of a coolant supplied to the cooling surface 41 is indicated by solid line arrows, and the flow of the coolant discharged from the cooling surface 41 is indicated by broken line arrows.

The shaft 4b has a hollow 42. In the plate 4a, radial grooves 43 are formed to communicate with the hollow 42 and extend outward in radial directions. In an outer periphery of the plate 4a, an arc groove 44 is formed to communicate with the radial grooves 43 and extend in a circumferential direction. Above the arc groove 44 is a cooling chamber 45 formed to communicate with the arc groove 44. An upper surface of the cooling chamber 45 is formed as the cooling surface 41. Further, a return flow path 46 that extends from the cooling chamber 45 to the hollow 42 is formed.

The supply flow path forming member 6 includes a flow path forming member 61 arranged in the hollow 42, a distribution mechanism 62, flow path forming members 63 arranged in the radial grooves 43, elbows 64 bent by 90°, and flow path forming members 65 arranged in the arc groove 44. The flow path forming members 65 are provided with cooling nozzles 66 configured to spray a coolant.

Here, the supply flow path forming member 6 is formed of a material having a lower thermal conductivity than that of the substrate stage 4 which is formed of, for example, aluminum. In particular, SUS, quartz, or the like may be used for the supply flow path forming member 6. The flow path forming members 61, 63, and 65 may be formed of, for example, a pipe (piping) or may be formed through cutting.

The flow path forming member 61 is disposed within the hollow 42. One end of the flow path forming member 61 is connected to the coolant supply source 13, and the other end of the flow path forming member 61 is connected to the distribution mechanism 62 disposed within the hollow 42. The coolant supplied from the coolant supply source 13 flows through the flow path forming member 61, and is supplied to the distribution mechanism 62.

The distribution mechanism 62 is arranged at the center in a plan view, the flow path forming member 61 is connected to the distribution mechanism 62 from the bottom, and the plurality of flow path forming members 63 are connected to the distribution mechanism 62 in radial directions. In the example illustrated in FIG. 3, three flow path forming members 63 are connected. The coolant supplied from the flow path forming member 61 is distributed by the distribution mechanism 62 and supplied to each of the flow path forming members 63.

The flow path forming members 63 are arranged in the radial grooves 43 extending radially outward from the hollow 42 in the plate 4a. Here, cross-sections of the radial grooves 43 and cross-sections of the outer diameter of the flow path forming members 63 are different from each other. That is, there are gaps between the radial grooves 43 and the flow path forming members 63. The gaps communicate with the hollow 42 and have air therein. Due to such configurations, heat transfer between the plate 4a of the substrate stage 4 and the flow path forming members 63 is suppressed. As a result, the coolant flowing through the flow path forming members 63 is supplied to the outer periphery of the plate 4a while suppressing a temperature increase.

Further, the gaps between the radial grooves 43 and the flow path forming members 63 may be filled with an insulation material. Also, it is preferred that the flow path forming members 63 are arranged in a manner not to be in contact with the radial grooves 43. For example, the flow path forming members 63 may be arranged in the radial grooves 43 through support members (not shown). Further, the flow path forming members 63 may be arranged to be partly in contact with the radial grooves 43. For example, the flow path forming members 63 may have protrusions (not shown) on outer peripheral surfaces thereof and may be in contact with walls of the corresponding radial grooves 43 at the protrusions.

The elbows 64 connect the flow path forming members 63 and the flow path forming members 65 at an angle of 90°. The flow path forming members 65 are arranged in the arc groove 44 and extend in the circumferential direction in the plate 4a. A plurality of arc grooves 44 may be formed in the plate 4a to correspond to the flow path forming member 65, or may be integrally formed as a ring-shaped communicating groove. The flow path forming members 65 have cooling nozzles 66 for spraying a coolant. As a result, the coolant supplied from the flow path forming members 63 flows through the flow path forming members 65, and is sprayed into the arc grooves 44 from the cooling nozzles 66 of the flow path forming members 65. Here, the cooling nozzles 66 are provided on upper portions of the flow path forming members 65, and the coolant is sprayed upward.

The cooling chamber 45 having the cooling surface 41 is disposed above the arc groove 44. The coolant sprayed from the cooling nozzles 66 flows in the arc groove 44, and is sprayed onto the cooling surface 41 of the cooling chamber 45. As a result, the cooling surface 41 is cooled. The cooling chamber 45 may be divided into a plurality of cooling chambers, or may be integrally formed as a ring-shaped communicating groove.

Further, the cooling nozzles 66 formed in the flow path forming member 65 are formed as nozzles having a small diameter (holes having a small diameter). As a result, it is possible to secure an internal pressure in the flow path forming members 65, and to make a flow rate of the coolant sprayed from each cooling nozzle 66 uniform. In addition, the coolant sprayed from each cooling nozzle 66 stirs the coolant in the arc groove 44 and the cooling chamber 45. As a result, it is possible to improve cooling efficiency on the cooling surface 41, and to improve temperature uniformity of the cooling surface 41.

Further, the coolant flows from the cooling chamber 45 through the return flow path 46, and is supplied to the hollow 42. Then, the coolant is discharged to the outside from the lower end of the shaft 4b.

According to the embodiment of the substrate stage 4, even when a gas coolant having a low heat capacity (e.g., air coolant) is used as the coolant, a coolant having a low temperature can be supplied to the cooling surface 41 because an increase in a temperature of the coolant (heat absorption) can be suppressed until the coolant reaches the cooling surface 41. As a result, it is possible to appropriately cool the cooling surface 41. Further, it is possible to improve controllability of the temperature of the staging surface of the substrate stage 4.

Further, since it is possible to use a gas coolant (e.g., air coolant) as the coolant, it is possible to improve performance of maintaining the substrate stage 4 so that the maintenance time can be shortened when compared to a case in which a liquid coolant is used. Since the air coolant is used as the coolant, it is possible to eliminate the risk of corrosion of the cooling flow path and to simplify the configuration of the apparatus.

As illustrated in FIG. 3, a distribution mechanism 62 is provided at the center, and each of the coolant flow paths (flow path forming members 63, elbows 64, and flow path forming members 65) is arranged to be branched out. As a result, the distance from the distribution mechanism 62 to an end 65b, which is the end of each coolant flow path, can be made uniform. As a result, distribution of the coolant flow rates can be made uniform among the coolant flow paths.

In the flow path forming members 65, the temperature of the coolant flowing in the ends 65b of end portions is higher than the temperature of the coolant flowing in ends 65a of inlets. Here, as illustrated in FIG. 3, the coolant flow paths (flow path forming members 63, elbows 64, flow path forming members 65) branched from the distribution mechanism 62 are arranged in a swastika (卍) shape. Specifically, the supply flow path forming member 6 is configured such that each one end of the plurality of flow path forming members 63 is connected to the distribution mechanism 62, each of the plurality of flow path forming members 63 extends radially from the distribution mechanism 62 (in a radial direction of the plate 4a), and each other end of the plurality of flow path forming members 63 is connected to the flow path forming member 65 having a circular arc shape via the elbow 64. The flow path forming member 63 and the flow path forming member 65 are connected and bent by 90° by the elbow 64. That is, when viewed from the top, the supply flow path forming member 6 has a shape in which a hub (the distribution mechanism 62) is disposed in the middle, spokes (the flow path forming members 63) extend radially from the hub, and a circular-shaped rim (the flow path forming member 65) is connected to each spoke, so as to have a wheel shape as a whole. In other words, the flow path forming members 65 are arranged such that an end 65b of one flow path forming member 65 and an end 65a of another flow path forming member 65 are adjacent to each other. That is, the plurality of flow path forming members 65 are arranged such that the flowing directions of the coolant in the flow path forming members 65 are the same rotational direction (clockwise in the example of FIG. 3).

As a result, because the cooling nozzles 66 (the cooling nozzles 66 near the ends 65a) from which the relatively low-temperature coolant is sprayed are provided close to the cooling nozzles 66 (the cooling nozzles 66 near the ends 65b) from which the relatively high-temperature coolant is sprayed, it is possible to improve the temperature uniformity in the circumferential direction of the staging surface of the substrate stage 4.

Figure 4:
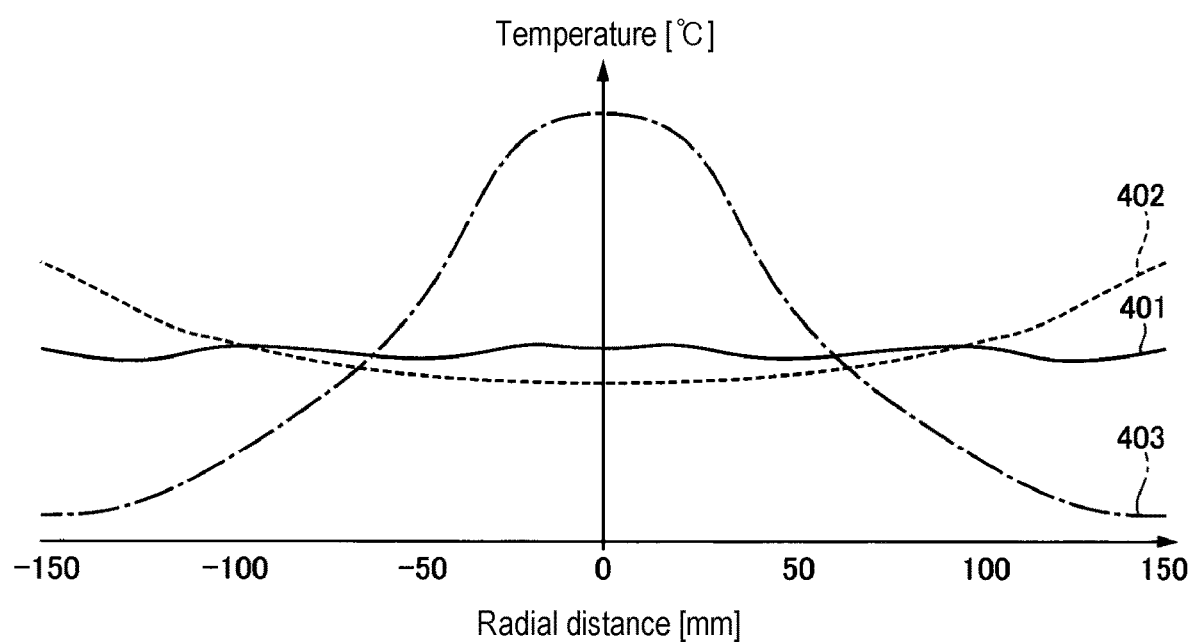
FIG. 4 illustrates an example of a temperature control performed by the substrate stage.

FIG. 4 illustrates an example of a temperature control performed by the substrate stage 4.

Based on the substrate stage 4, it is possible to control generation of heat by the heaters 5 (the heaters 51 to 53) and the cooling by the cooling surface 41 by controlling the heater power supply 12 and the coolant supply source 13. As a result, it is possible to generate a desired temperature distribution on the staging surface of the substrate stage 4.

For example, as in a temperature distribution 401 indicated by a solid line, it is possible to generate a substantially uniform temperature distribution in a radial direction. Further, as in a temperature distribution 402 indicated by a broken line, it is possible to generate a temperature distribution in which the temperature of an outer side in the radial direction increases. Further, as in a temperature distribution 403 indicated by a one-dot chain line, it is possible to generate a temperature distribution in which the temperature of an outer side in the radial direction drops.

For example, in the substrate processing apparatus 1 illustrated in FIG. 1, it may be considered that, since the clamp ring 9 is in contact with the outer peripheral portion of the top surface of the substrate W, heat transfer occurs between the substrate W and the clamp ring 9, and thus the temperature of the surface of the substrate W drops in the outer peripheral portion. By setting the temperature distribution of the staging surface of the substrate stage 4 to the temperature distribution 402 such that the temperature of the outer side in the radial direction rises, it is possible to improve the uniformity in the surface temperature of the substrate W.

Although the substrate processing apparatus 1 has been described above, the present disclosure is not limited to the above-described embodiment or the like, and can be modified in various ways and improved within the scope of the present disclosure described in the claims.

Although the supply flow path forming member 6 illustrated in FIG. 3 has been described as having three branches at the distribution mechanism 62, the number of branches may be two, or four or more.

In the substrate stage 4 shown in FIG. 2, the cooling surface 41 has been described as being provided on the outer peripheral side of the plate 4a, but the present disclosure is not limited thereto. For example, the cooling surface may be provided at the center of the plate 4a. For example, the ceiling surface of the hollow 42 may be the cooling surface at the center. In such a case, a flow path of a coolant may be formed from the distribution mechanism 62 to the cooling surface at the center. The coolant sprayed from the flow path is sprayed onto the cooling surface at the center, and the cooling surface is cooled. Further, the coolant flows downward through the hollow 42 and is discharged to the outside from the lower end of the shaft 4b.

As a result, it is possible to form the cooling surface 41 not only on the outer periphery of the plate 4a, but also at the center of the plate 4a. Accordingly, the temperature distribution having the temperature distribution with an increase in the temperature of the outer side in the radial direction (see the temperature distribution 402 in FIG. 4), for example, can be generated. Further, a configuration having at least one of the cooling surface 41 on the outer periphery or the cooling surface at the center may be adopted.

Figure 5:
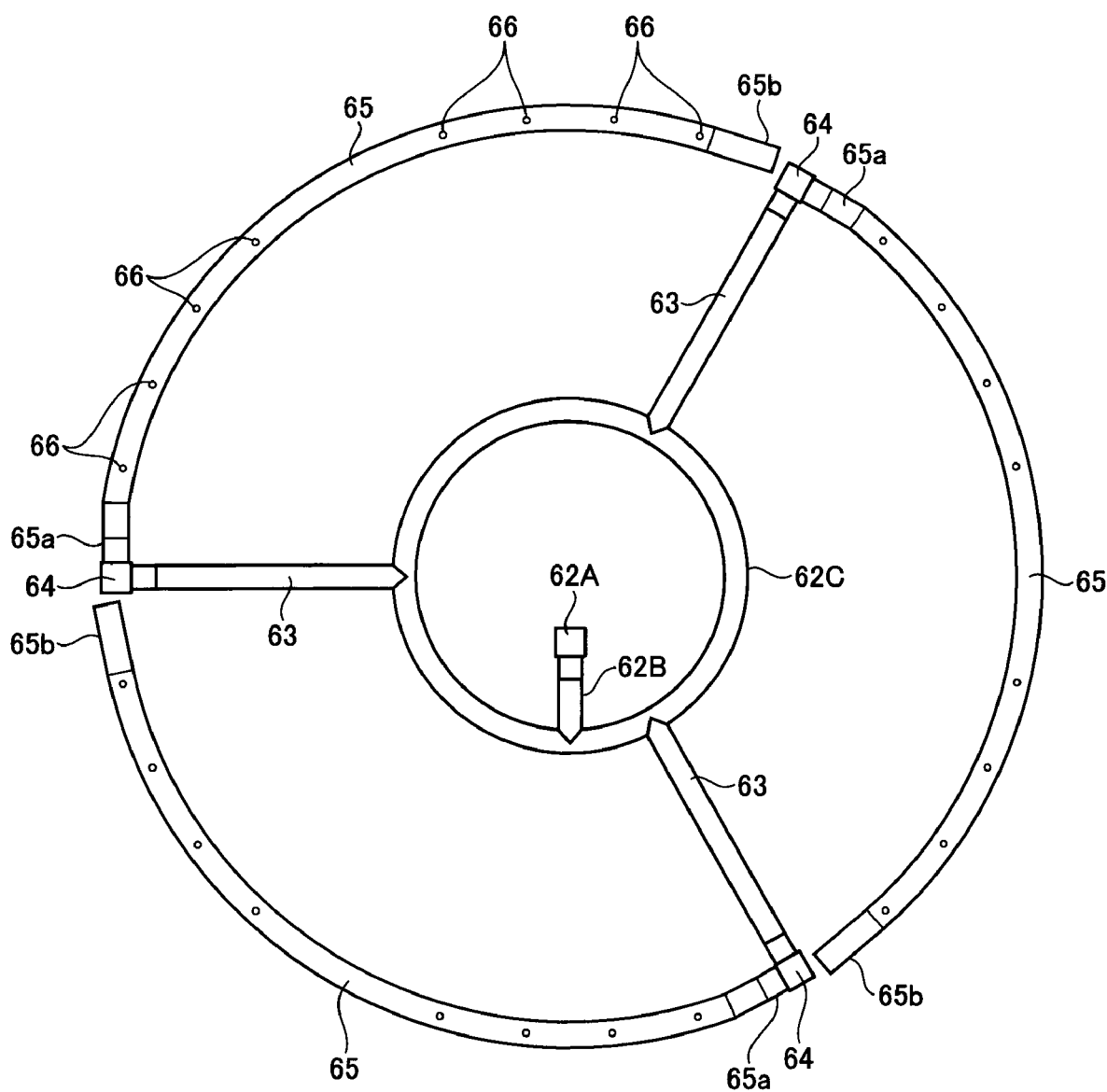
FIG. 5 is another example of a plan view illustrating the supply flow path forming member.

FIG. 5 is an example of a plan view illustrating a supply flow path forming member 6A. The supply flow path forming member 6A includes a flow path forming member 61 (not shown in FIG. 5) arranged in the hollow 42, an elbow 62A bent by 90°, a flow path forming member 62B, a circular path forming member 62C, flow path forming members 63 arranged in radial grooves 43, elbows 64 bent by 90°, and flow path forming members 65 disposed in an arc groove 44. The flow path forming members 65 are provided with cooling nozzles 66 configured to spray a coolant.

The coolant supplied from the coolant supply source 13 flows through the flow path forming member 61, the elbow 62A, and the flow path forming member 62B, and is supplied to the circular flow path forming member 62C. The coolant supplied to the flow path forming member 62C is dispersed within the flow path forming member 62C. The plurality of flow path forming members 63 are connected to the flow path forming member 62C in radial directions. In the example illustrated in FIG. 5, three flow path forming members 63 are connected. As a result, the coolant is supplied from the flow path forming member 62C to each flow path forming member 63. The rest is the same as the supply flow path forming member 6 illustrated in FIG. 3.

According to the supply flow path forming member 6A illustrated in FIG. 5, the position of the flow path forming member 61 arranged within the hollow 42 in the shaft 4b may be offset from the center of the shaft 4b. As a result, the degree of freedom in the layout of the flow path forming member 61 arranged in the hollow 42 can be improved.

The substrate processing apparatus 1 has been described as being a thermal CVD apparatus, but the present disclosure is not limited thereto. The substrate processing apparatus 1 may be, for example, a plasma CVD apparatus, a thermal ALD apparatus, a plasma ALD apparatus, a PVD apparatus, or the like. In addition, the substrate processing apparatus 1 has been described as being an apparatus for performing a film forming process on a substrate W, but is not limited thereto, and may perform other processes such as an etching process. That is, the substrate processing apparatus 1 may be a CVE apparatus, an ALE apparatus, or the like.

According to an aspect of the present disclosure, it is possible to provide a substrate stage and a substrate processing apparatus that appropriately control the temperature of a staging surface on which a substrate is placed.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate stage comprising:
a stage base including a cooling surface therein; and
a supply flow path forming member formed of a material having a lower thermal conductivity than that of the stage base and including cooling nozzles configured to spray a coolant toward the cooling surface,
wherein:
the supply flow path forming member includes first flow path forming members extending in radial directions of the stage base,
the stage base includes first grooves in which the first flow path forming members are disposed, and
a shape of cross-sections of the first flow path forming members is different from a shape of cross-sections of the first grooves.

2. The substrate stage of claim 1, wherein:
the supply flow path forming member further includes second flow path forming members connected to the first flow path forming members and extending in a circumferential direction of the stage base, and
the cooling nozzles are formed in the second flow path forming members.

3. The substrate stage of claim 2, wherein:
the supply flow path forming member includes:
branches;
the first flow path forming members connected to the branches; and
the second flow path forming members respectively connected to the first flow path forming members, and
the second flow path forming members are arranged such that an inlet of one of the second flow path forming members is adjacent to an end of another one of the second flow path forming members.

4. The substrate stage of claim 3, wherein the coolant is an air coolant.

5. The substrate stage of claim 1, wherein the coolant is an air coolant.

6. A substrate processing apparatus comprising:
a substrate stage which comprises:
a stage base including a cooling surface therein; and
a supply flow path forming member formed of a material having a lower thermal conductivity than that of the stage base and including cooling nozzles configured to spray a coolant toward the cooling surface,
wherein:
the supply flow path forming member includes first flow path forming members extending in radial directions of the stage base,
the stage base includes first grooves in which the first flow path forming members are disposed, and
a shape of cross-sections of the first flow path forming members is different from a shape of cross-sections of the first grooves.

* * * * *